(12) United States Patent
Lee et al.

(10) Patent No.: US 8,969,153 B2
(45) Date of Patent: Mar. 3, 2015

(54) NAND STRING CONTAINING SELF-ALIGNED CONTROL GATE SIDEWALL CLADDING

(71) Applicant: SanDisk Technologies, Inc., Plano, TX (US)

(72) Inventors: Donovan Lee, Santa Clara, CA (US); Vinod Purayath, Santa Clara, CA (US); James Kai, Santa Clara, CA (US); George Matamis, Danville, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/932,060

(22) Filed: Jul. 1, 2013

(65) Prior Publication Data

US 2015/0001607 A1    Jan. 1, 2015

(51) Int. Cl.
| | |
|---|---|
| *H01L 21/336* | (2006.01) |
| *H01L 21/28* | (2006.01) |
| *H01L 27/115* | (2006.01) |
| *H01L 29/423* | (2006.01) |

(52) U.S. Cl.
CPC .... *H01L 21/28273* (2013.01); *H01L 27/11517* (2013.01); *H01L 29/42328* (2013.01)
USPC ...................... 438/258; 438/596; 257/E21.69

(58) Field of Classification Search
USPC .................................. 438/267, 588, 594, 596
See application file for complete search history.

(56) References Cited

U.S. PATENT DOCUMENTS

| | | | |
|---|---|---|---|
| 5,570,315 A | 10/1996 | Tanaka et al. | |
| 5,774,397 A | 6/1998 | Endoh et al. | |
| 6,015,738 A | 1/2000 | Levy et al. | |
| 6,046,935 A | 4/2000 | Takeuchi et al. | |
| 6,407,424 B2 | 6/2002 | Forbes | |
| 6,646,302 B2 | 11/2003 | Kan et al. | |
| 6,656,792 B2 | 12/2003 | Choi et al. | |
| 6,859,397 B2 | 2/2005 | Lutze et al. | |
| 6,881,994 B2 | 4/2005 | Lee et al. | |
| 6,913,984 B2 | 7/2005 | Kim et al. | |
| 6,917,542 B2 | 7/2005 | Chen et al. | |
| 6,927,136 B2 | 8/2005 | Lung et al. | |
| 6,991,984 B2 | 1/2006 | Ingersoll et al. | |

(Continued)

FOREIGN PATENT DOCUMENTS

DE    10 2008 009365 A1    10/2008

OTHER PUBLICATIONS

Chan et al., "A True Single-Transistor Oxide-Nitride-Oxide EEPROM Device," IEEE Electron Device Letters, vol. EDL-8, No. 3, Mar. 1987, pp. 93-95.

(Continued)

*Primary Examiner* — Chandra Chaudhari
(74) *Attorney, Agent, or Firm* — The Marbury Law Group PLLC (57) ABSTRACT

A method of making a NAND string includes forming a tunnel dielectric over a semiconductor channel, forming a charge storage layer over the tunnel dielectric, forming a blocking dielectric over the charge storage layer, and forming a control gate layer over the blocking dielectric. The method also includes patterning the control gate layer to form a plurality of control gates separated by trenches, and reacting a first material with exposed sidewalls of the plurality of control gates to form self aligned metal-first material compound sidewall spacers on the exposed sidewalls of the plurality of control gates.

8 Claims, 7 Drawing Sheets

(56) References Cited

U.S. PATENT DOCUMENTS

| | | | |
|---|---|---|---|
| 7,045,851 | B2 | 5/2006 | Black et al. |
| 7,119,395 | B2 | 10/2006 | Gutsche et al. |
| 7,138,680 | B2 | 11/2006 | Li et al. |
| 7,173,304 | B2 | 2/2007 | Weimer et al. |
| 7,259,984 | B2 | 8/2007 | Kan et al. |
| 8,143,662 | B2 * | 3/2012 | Endo et al. ............. 257/314 |
| 2004/0026682 | A1 | 2/2004 | Jiang |
| 2004/0130941 | A1 | 7/2004 | Kan et al. |
| 2004/0180491 | A1 | 9/2004 | Arai et al. |
| 2004/0256662 | A1 | 12/2004 | Black et al. |
| 2005/0112820 | A1 | 5/2005 | Chen et al. |
| 2005/0122775 | A1 | 6/2005 | Koyanagi et al. |
| 2005/0258470 | A1 | 11/2005 | Lojek et al. |
| 2005/0287717 | A1 | 12/2005 | Heald et al. |
| 2006/0250836 | A1 | 11/2006 | Herner et al. |
| 2006/0250837 | A1 | 11/2006 | Herner et al. |
| 2007/0045604 | A1 | 3/2007 | Liu et al. |
| 2007/0141820 | A1 | 6/2007 | Hyun |
| 2009/0001345 | A1 | 1/2009 | Schricker et al. |
| 2009/0014704 | A1 | 1/2009 | Chen et al. |
| 2009/0027944 | A1 | 1/2009 | Ufert |
| 2009/0117697 | A1 | 5/2009 | Park et al. |
| 2009/0146140 | A1 | 6/2009 | Kim et al. |
| 2009/0168491 | A1 | 7/2009 | Schricker et al. |
| 2010/0008128 | A1 | 1/2010 | Yoshii et al. |
| 2010/0173485 | A1 | 7/2010 | Lee et al. |
| 2011/0020992 | A1 | 1/2011 | Purayath et al. |
| 2011/0186799 | A1 | 8/2011 | Kai et al. |
| 2011/0204433 | A1 | 8/2011 | Fujita et al. |
| 2012/0028450 | A1 * | 2/2012 | Son et al. ............. 438/479 |

OTHER PUBLICATIONS

Nozaki et al., "A 1-Mb EEPROM with MONOS Memory Cell for Semiconductor Disk Application," EEE Journal of Solid-State Circuits, vol. 26, No. 4, Apr. 1991, pp. 497-501.

Komatsu et al., "Applying Nanotechnology to Electronics," Science & Technology Trends, Quarterly Review No. 16, Jul. 2005, pp. 36-45.

Guarini et al., "Low Voltage, Scalable Nanocrystal Flash Memory Fabricated by Templated Self-Assembly," IEEE Int. Electron Devices Meeting Tech. Diges, vol. 22, No. 2, Dec. 2003, pp. 1-4.

U.S. Appl. No. 61/667,007, V. Purayath et al., "NAND Memory Device Containing Nanodots," filed Jul. 2, 2012.

U.S. Appl. No. 13/708,587, V. Purayath et al., "NAND Memory Device Containing Nanodots and Method of Making Thereof," Specification and drawings, filed Dec. 7, 2012.

U.S. Appl. No. 13/708,677, V. Purayath et al., "Non-Volatile Memory Structure Containing Nanodots and Continuous Metal Layer Charge Traps and Method of Making Thereof," Specification and drawings, filed Dec. 7, 2012.

Partial International Search Report, International Application No. PCT/US2011/023617, May 24, 2011.

International Preliminary Report on Patentability, International Application No. PCT/US2011/023617, Aug. 16, 2012.

International Search Report & Written Opinion, International Application No. PCT/US2011/023617, Jul. 13, 2011.

Matsuda et al., "Performance Improvement of Metal Gate CMOS Technologies," 2001 Symposium on VLSI Technology Digest of Technical Papers, Kyoto, Japan.

U.S. Appl. No. 13/690,054, "Select Gate Formation for NanoDot Flat Cell," filed Nov. 30, 2012, Purayath et al., Specification and drawings.

European International Searching Authority, Invitation to Pay Additional Fees and, Where Applicable, Protest Fee, European Patent Office, International Application No. PCT/US2014/0044637, mailed Sep. 29, 2014.

European International Searching Report, European Patent Office, International Application No. PCT/US2014/0044637, mailed Sep. 29, 2014.

International Search Authority, Notification of International Search Report and Written Opinion of the International Search Authority for PCT/US2014/044637, mailed Nov. 17, 2014.

* cited by examiner

NAND STRING CONTAINING SELF-ALIGNED CONTROL GATE SIDEWALL CLADDING

FIELD OF THE INVENTION

The present invention relates to NAND memory devices and methods of fabricating NAND memory devices having control gate cladding.

BACKGROUND

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Figure 1:
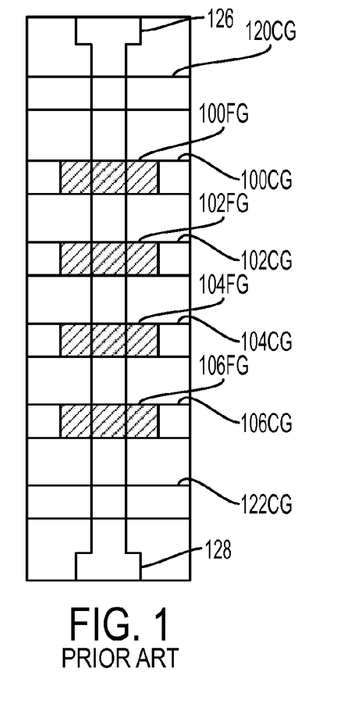
FIG. 1 is a top view of a prior art NAND string.
Figure 2:
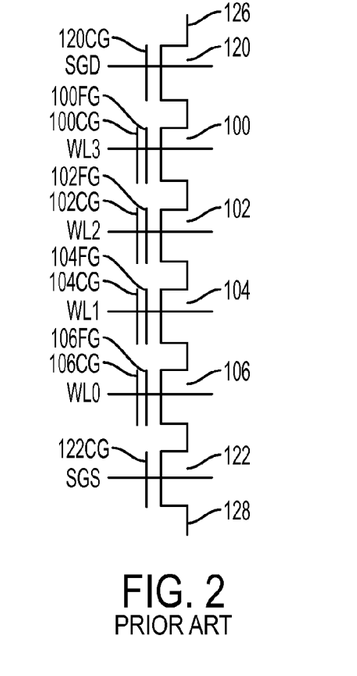
FIG. 2 is an equivalent circuit diagram of the prior art NAND string depicted in FIG. 1.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

SUMMARY

One embodiment of the invention includes a method of making a NAND string comprising forming a tunnel dielectric over a semiconductor channel, forming a charge storage layer over the tunnel dielectric, forming a blocking dielectric over the charge storage layer, and forming a control gate layer over the blocking dielectric. The method also includes patterning the control gate layer to form a plurality of control gates separated by trenches, and reacting a first material with exposed sidewalls of the plurality of control gates to form self aligned metal-first material compound sidewall spacers on the exposed sidewalls of the plurality of control gates.

Another embodiment of the invention includes a NAND string, comprising a semiconductor channel, a tunnel dielectric located over a semiconductor channel, a plurality of floating gates separated by trenches located over the tunnel dielectric, and a plurality of blocking dielectric regions separated by the trenches. Each of the plurality of blocking dielectric regions is located over at least a respective one of the plurality of floating gates. The string also includes a plurality of control gates separated by the trenches, where each of the plurality of gates is located over a respective one of the plurality of blocking dielectric regions, and a plurality of metal-first material compound sidewall spacers located on sidewalls of control gates. The sidewall spacers may comprises metal silicide sidewall spacers which may protrude into the trenches beyond sidewalls of respective floating gates located under the control gates.

BRIEF DESCRIPTION OF THE DRAWINGS

The accompanying drawings, which are incorporated herein and constitute part of this specification, illustrate exemplary embodiments of the invention, and together with the general description given above and the detailed description given below, serve to explain the features of the invention.

FIGS. 6A-9D are side cross-section views of steps in a NAND string fabrication process according to one embodiment.

DETAILED DESCRIPTION

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims. Various embodiments include a NAND string with control gates having metal compound sidewall spacers, such as metal silicide spacers located, on sidewalls of the plurality of control gates. The control gates may be metal, metal nitride, doped semiconductor (e.g., polysilicon, polycrystalline silicon germanium or single crystalline silicon), or metal oxide (e.g., ruthenium oxide, etc.) control gates. These materials may be silicided to form different cladding surfaces (e.g., silicide sidewall spacers). The spacers are formed selectively in self alignment on the control gates to provide a diffusion barrier during the etching of the NAND memory stacks. Preferably, the control gates comprise metal or metal nitride control gates, such as tungsten or tungsten nitride control gates, which can be silicided to form spacers by reacting the control gate with a silicon (e.g., amorphous silicon or polysilicon) layer. In this case, the spacers prevent or reduce amount of at least one of tungsten oxide whiskers, tungsten surface diffusion and etch byproducts generated during the stack etching. Alternatively, doped silicon or silicon germanium control gates can be silicided to form spacers by reacting the control gates with a metal layer (e.g., tungsten, titanium or other silicide forming metals).

Various embodiments described below and illustrated in FIGS. 3, 4 and 5 include non-volatile memory devices and methods of fabricating such devices in which the individual memory elements comprise NAND strings in a "flat cell" configuration. In a "flat cell" configuration, discrete memory elements (i.e., cells) are formed as a stack 176, including a charge storage region 332, such as a floating gate, and a blocking dielectric layer 334 aligned over the charge storage region, where the blocking dielectric does not "wrap-around" the sides of the charge storage region. A control gate 336 is formed over the blocking dielectric 334 and the charge storage region 332. Exemplary embodiments of memory devices having a "flat cell" design and methods of fabricating such devices are disclosed in U.S. Patent Application Publication No. 2011/0020992, published on Jan. 27, 2011, the entire contents of which are incorporated herein by reference.

However, the present invention is not limited to the "flat cell" configuration, and any other NAND string configuration, such as any horizontal NAND string configuration, may be used, including configurations, where the blocking dielectric does wrap-around the sides of the charge storage region. Furthermore, while the charge storage region 332 is described as an electrically conductive or semiconducting (e.g., polysilicon) floating gate, the charge storage region 332 may instead comprise a non-conductive dielectric material (e.g., a silicon nitride layer and/or an ONO stack) or conductive nanoparticles embedded in a dielectric material in place of the floating gate.

Figure 3:
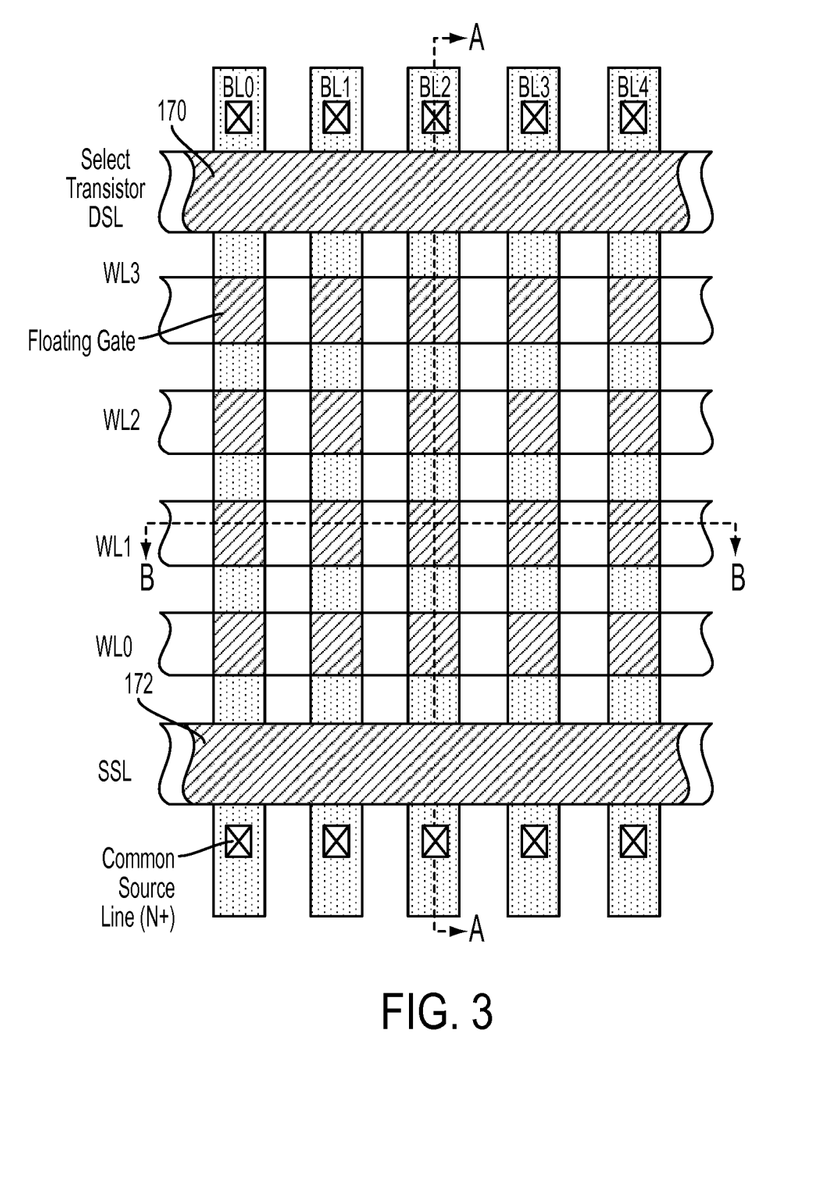
FIG. 3 is a plan view of a portion of a NAND flash memory array of a comparative example.
Figure 4:
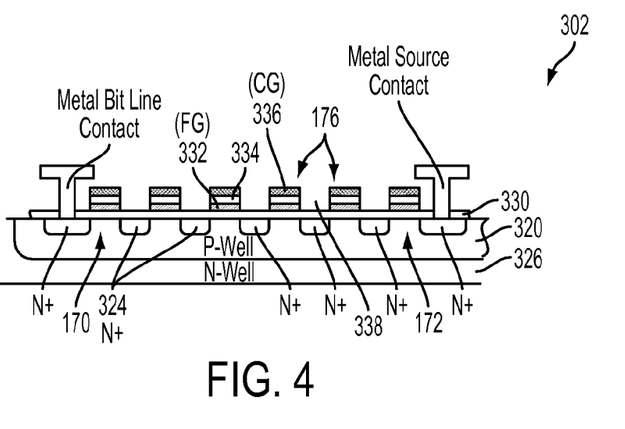
FIG. 4 is an orthogonal cross-section view taken along line A-A of the portion of the flash memory array depicted in FIG. 3.

A portion of a comparative example NAND memory array is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates. FIG. 4 is a side cross-sectional view taken along line A-A (i.e., y-direction) of FIG. 3, depicting one NAND string 302 having control gate lines 336 are formed. The cross-sectional view taken along line B-B is shown as the x-direction view in FIG. 5.

The control gate lines 336 are typically formed over the floating gates 332 as a self-aligned stack 176, and are capacitively coupled to the floating gates through an intermediate (blocking) dielectric 334. The top and bottom of the string connect to a bit line and a common source line through select gate transistors having gates 170 and 172, respectively. Select gate 170 is controlled by selection line DSL and select gate 172 is controlled by selection line SSL. In traditional devices, the floating gate material (332) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

Figure 5:
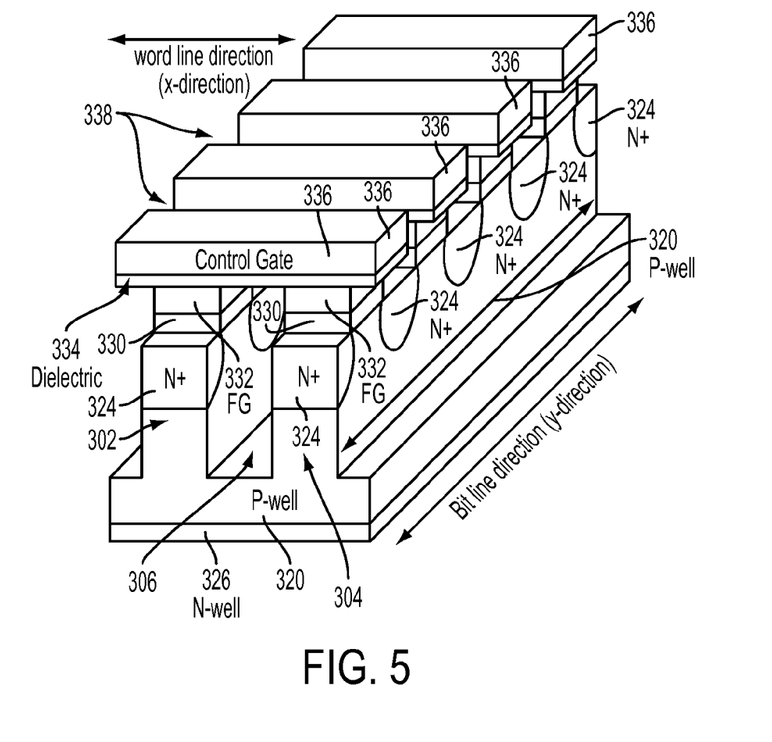
FIG. 5 is a three-dimensional view of a pair of four word line long portions of two NAND strings of a comparative example.

FIG. 5 is a three-dimensional block diagram of two NAND strings 302 and 304 according to a comparative example that may be fabricated as part of a larger flash memory array. FIG. 5 depicts four memory cells on strings 302 and 304 as an example. In the embodiment depicted in FIG. 5, NAND string 302 is separated from NAND string 304 by an open area or void 306. Typically, an insulating material or dielectric is formed between adjacent NAND strings in this open area 306 to provide electrical isolation in the x-direction (word line direction) between adjacent strings 302, 304.

FIG. 5 depicts the NAND channel 320 as a silicon P-well above a silicon N-well 326 in a silicon substrate. The P-type silicon substrate below N-well 326 is not shown in FIG. 5. However, any other semiconductor channel may be used. Doped "source" and "drain" regions (e.g., N+ doped silicon regions) 324 are located in the channel 320 between the stacks 176. Each NAND string includes a continuous tunnel dielectric (e.g., silicon oxide or one or more other dielectric layers) 330 over the channel 320. Each stack 176 containing the floating gate 332, the blocking dielectric region 334 and control gate 336 is separated in the y-direction from adjacent stacks 176 in each string 302, 304 by a trench 338. Each trench 338 is located above a respective doped region 324.

The bit line or y-direction runs along the NAND strings, and the word line or x-direction runs perpendicular to the NAND string or the bit line direction. The word line direction may also be referred to as the row direction and the bit line direction referred to as the column direction. In one embodiment, the control gates form the word lines. A continuous layer of conductive material 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

The present inventors recognized that when the control gates 336 comprise a metal, such as tungsten, the etching of the stacks 176 generates one or more of tungsten oxide whiskers, tungsten surface diffusion and etch byproducts. This creates contamination of the NAND device and decreases the NAND device performance, such as a decrease in endurance. The present inventors recognized that metal compound spacers, such as metal silicide, metal germanide or metal nitride spacers located on sidewalls of the plurality control gates provide an effective diffusion barrier during the etching of the NAND memory stacks. The spacers may be formed selectively on the control gates in self alignment. For tungsten or tungsten nitride control gates, the spacers prevent or reduce amount of at least one of tungsten oxide whiskers, tungsten surface diffusion and etch byproduct generated during the stack etching.

FIGS. 6A-9D are cross-sectional views depicting the steps in the fabrication of a non-volatile memory array (e.g., NAND strings) in accordance with one embodiment. The described embodiment is exemplary only and should not be taken as limiting the disclosure. The exact materials, dimensions and order of processing may vary according to the requirements of individual implementations.

FIGS. 6A, 7A, 8A and 9A are side cross sectional views in the y-direction illustrating the formation of peripheral transistor in the peripheral circuitry area 602 of a substrate. FIGS. 6B, 7B, 8B and 9B are side cross sectional views in the y-direction illustrating the formation the NAND strings (e.g., memory cell stacks) in the active memory cell areas 604A, 604B of the substrate, and the select gate area 606. FIGS. 6C, 7C, 8C and 9C are side cross sectional views in the x-direction along line C-C through a stack 176 in FIG. 6B illustrating the formation the NAND string in the active memory cell area 604A. FIGS. 6D, 7D, 8D and 9D are side cross sectional views in the x-direction along line D-D through a trench 338 in FIG. 6B illustrating the formation the NAND string in the active memory cell area 604A.

FIGS. 6A-6D depict a substrate (e.g., a silicon substrate or wafer or any other semiconductor or semiconductor on insulator (SOI) substrate) having active memory cell areas 604A, 604B, select gate area 606, and a peripheral circuitry area 602. One or more wells (e.g., a triple well of p-type and/or n-type ion implanted regions), not shown, are typically formed in the substrate prior to forming a layer stack over the substrate surface. The term substrate may include reference to these well regions. The well regions include the NAND semiconductor channel region 320, such as a P-type doped silicon well.

A tunnel dielectric layer 330, such as an oxide (e.g., $SiO_2$) layer, is formed over the substrate 320 in areas 602, 604A, 604B and 606. The tunnel dielectric layer 330 can be formed in one embodiment by growing a layer of $SiO_2$ by dry or wet oxidation of the silicon substrate 320. A $SiO_2$ CVD or ALD deposition process could alternately be used. The tunnel dielectric layer 330 may have a thickness of 5-10 nm, such as 7-8 nm.

Following tunnel dielectric formation, a charge storage layer 330A is formed over the tunnel dielectric. The charge storage layer 330A may be a floating gate layer, preferably a polysilicon layer deposited by chemical vapor deposition or another suitable method. Other floating gate materials, such as an aluminum layer or refractory metal (e.g., Ru) nanodots embedded in a dielectric material may be used. Alternatively, a silicon nitride layer which is part of an ONO film may be used as the charge storage film.

A blocking dielectric 334 is then be formed floating gate layer 332. The blocking dielectric (i.e., inter-gate dielectric) 334 may comprise a silicon oxide layer or a plurality of layers, including oxide-nitride-oxide (ONO) layers, an aluminum oxide ($Al_2O_3$) layer, and a hafnium oxide ($HfO_2$) layer. In some embodiments, the blocking dielectric may include all high-k dielectric materials, such as $Al_2O_3/HfO_2$ instead of an $ONO/Al_2O_3/HfO_2$ stack.

Optionally, the substrate (e.g., P-well 320) may be etched to define a plurality of shallow isolation trenches 342 that divide the substrate into isolated active areas between the isolation trenches. The isolation trenches 342 may be gap-filled by depositing (e.g., spin coating) an isolation material 344, such as silicon oxide formed from a polysilazane (PSZ) precursor or another flowable trench fill material, such as spin-on glass. The isolation trench 342 and gap fill 344 formation steps may be conducted at any time during the device formations steps, such as after the blocking dielectric 334 formation, for example.

A control gate layer 336A is then formed over the blocking dielectric 334. The control gate layer may comprise any suitable metal or metal nitride, such as a refractory metal or metal nitride. Examples of the control gate layer material include tungsten or tungsten nitride. Other materials, such as other refractory metal (e.g., titanium), doped semiconductor or metal oxide may also be used.

In one embodiment an optional second control gate layer 336B may also be formed. The second control gate layer 336B may be a lower polysilicon control gate layer located over the blocking dielectric 334 and under the upper tungsten or tungsten nitride control gate layer 336A. Thus, layer 336B, if present, is formed before layer 336A.

If desired, an optional hard mask 340 is formed over the control gate layer 336A. In one embodiment, the hard mask comprises a pad dielectric layer 340A (e.g., a 10-20 nm, such as about 15 nm thick silicon nitride layer) and an overlying hard mask layer 340B (e.g., a silicon oxide layer or one or more other hard mask layers) formed over pad layer 340A. For example, layer 340B may be formed by CVD using a TEOS source.

Figure 6A:
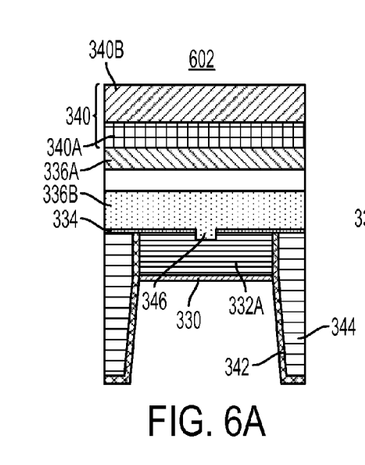
Figure 6B:
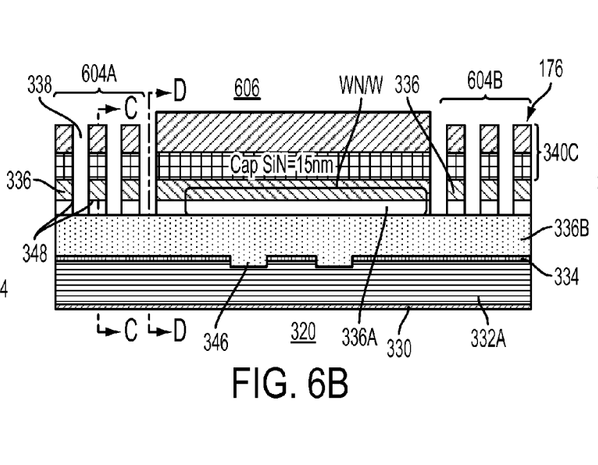
Figure 6D:
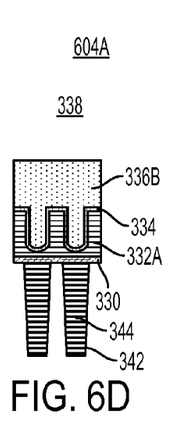
Figure 7A:
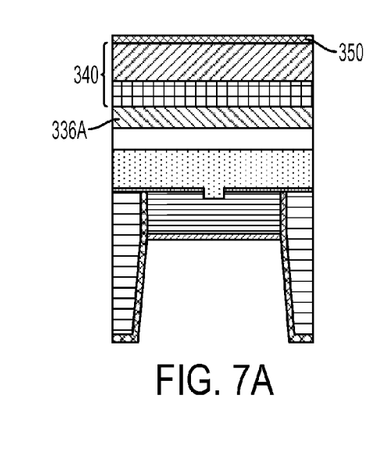
Figure 7B:
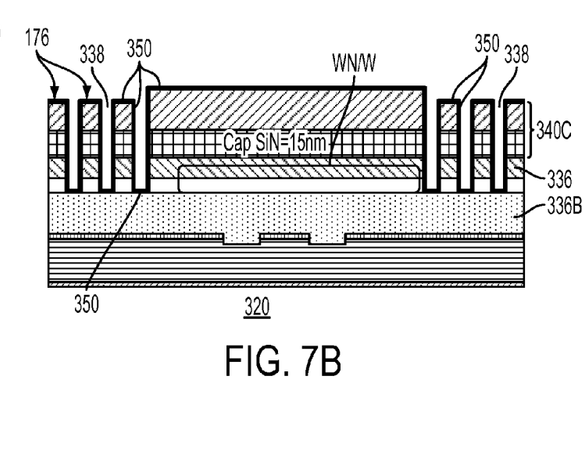
Figure 7C:
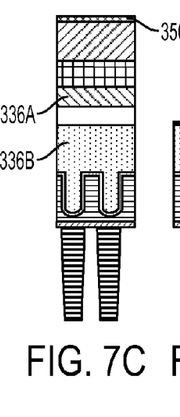
Figure 7D:
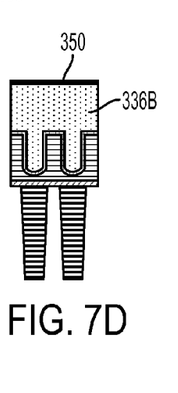

The control gate layer 336A is then patterned in the active cell areas 604A, 604B to form a plurality of control gates 336 separated by trenches 338 as shown in FIGS. 6B-6D. Any suitable patterning method may be used. For example, a photoresist layer or another lithography mask (not shown) is formed over the hard mask 340 and patterned using lithography. The patterned photoresist is then used as a mask during a first etching step to etch the control gate layer 336A. The first etching step is stopped prior to reaching the semiconductor channel. Preferably, the first etching step comprises etching the hard mask 340 (e.g., layers 340A and 340B) and the control gate layer 336A to form a plurality of stacks 176 separated by the trenches 338, and stopping the first etching step etch on the polysilicon control gate layer 336B. At this point shown in FIG. 6B, each of the plurality of stacks 176 comprises a portion of the tungsten or tungsten nitride control gate layer 336A (i.e., tungsten or tungsten nitride control gate 336) covered by a hard mask region 340C.

The layers in the peripheral area 602 are not patterned, as shown in FIG. 6A. As shown in FIGS. 6A and 6B, the floating gate layer 332A and the lower polysilicon control gate layer 336B may be electrically shorted to each other in the peripheral and the select gate areas 602, 606. The short 346 may comprise a portion of the lower polysilicon control gate layer 336B extending through an opening in the blocking dielectric 334 to contact the floating gate layer 332A.

A reactive material is then reacted with the sidewalls, such as the metal or metal nitride sidewalls 348 of the plurality of control gates 336 exposed in the trenches 338 to form self aligned metal-reactive material compound sidewall spacers 352 on the exposed metal or metal nitride sidewalls 348 of the plurality of control gates 336 as will be described in reference to FIGS. 7 and 8 below. Any suitable reaction method may be used.

In a first embodiment, the spacers 352 are formed by reacting the control gates with a solid layer of reactive material. As shown in FIGS. 7A, 7B, 7C and 7D, a reactive material layer 350 is deposited into the trenches 338 such that the layer 350 contacts the exposed metal or metal nitride sidewalls 348 of the plurality of control gates 336. This is followed by annealing the layer 350 to react the layer 350 with the exposed metal or metal nitride sidewalls 348 of the plurality of control gates 336 to form the spacers 352.

In one embodiment, the reactive material layer 350 comprises a Group IV semiconductor layer, such as silicon, germanium or silicon-germanium. In this embodiment, the compound sidewall spacers 352 comprise metal-Group IV compound sidewall spacers, such as metal silicide, metal germanide or metal silicide germanide spacers. Preferably, the reactive material layer 350 comprises a silicon layer and the sidewall spacers 352 comprise metal silicide sidewall spacers. For example, if the control gates 336 comprise tungsten or tungsten nitride, then the metal silicide sidewall spacers 352 comprise tungsten silicide sidewall spacers. Alternatively, if the control gates 336 comprise titanium, then the metal silicide sidewall spacers 352 comprise titanium silicide sidewall spacers.

Preferably, the silicon layer 350 comprises an amorphous silicon layer. Alternatively, layer 350 may comprise polysilicon. As shown in FIGS. 7A-7D, the step of depositing the silicon layer 350 into the trenches 338 comprises depositing the silicon layer 350 into the trenches 338 and over the hard mask regions 340C of the plurality of stacks 176 such that the silicon layer 350 contacts upper portions of the polysilicon control gate layer 336B exposed in the trenches 338. Layer 350 is deposited in all areas on the substrate, such as areas 602, 604A, 604B and 606. The silicon layer 350 is located on top of the hard mask 340 in the peripheral area 602 and in the select gate area 606. Layer 350 may be formed by plasma enhanced chemical vapor deposition (PECVD), low-pressure chemical vapor deposition (LPCVD), or other suitable processes.

Figure 8A:
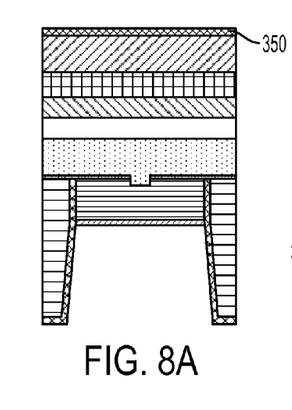
Figure 8B:
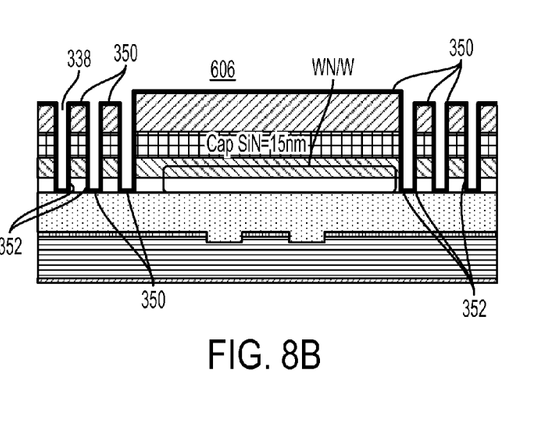
Figure 8C:
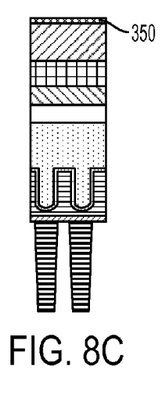
Figure 8D:
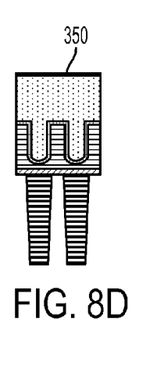

As shown in FIGS. 8B, 8C and 8D, the reactive material layer (e.g., silicon layer 350) is reacted with exposed metal or metal nitride sidewalls 348 of the plurality of control gates 336 in the trenches 338 to form self aligned metal-reactive material compound (e.g., metal silicide) sidewall spacers 352 on the exposed metal or metal nitride sidewalls 348 of the plurality of control gates 336.

Preferably, the step of reacting takes place by annealing the layer 350. Preferably, the annealing comprises a rapid thermal annealing method which is typically used to react silicon and metal to form a metal silicide. Layer 350 remains unreacted in contact with the other materials exposed in the trenches 338. As shown in FIGS. 8A and 8C, layer 350 also remains on the upper surface of the hard mask 340. In other words, the metal silicide spacers 352 are formed in self alignment only in locations where the metal or metal nitride control gate 336 sidewalls 348 are exposed in the trenches 338.

Figure 9A:
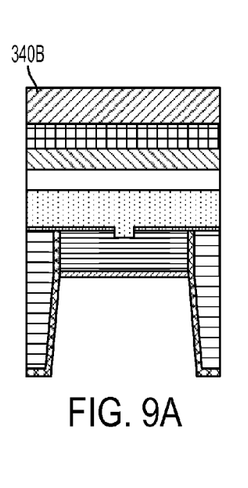
Figure 9B:
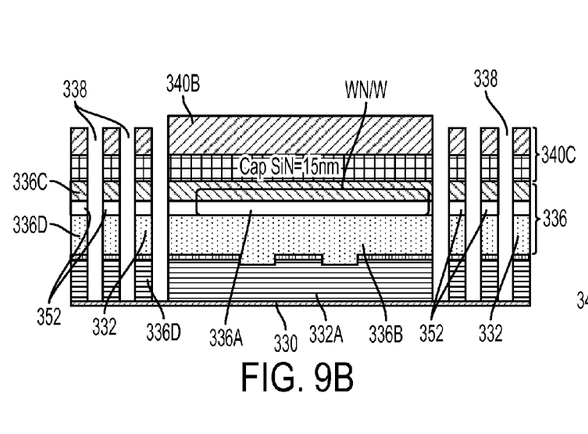
Figure 9C:
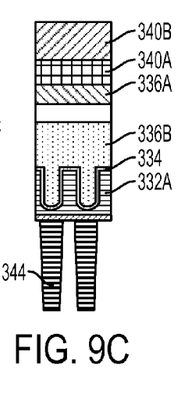
Figure 9D:
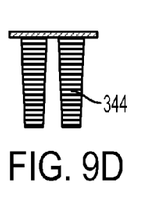

As shown in FIGS. 9B, 9C and 9D, a second etching step is performed after the spacer 352 formation. During the second etching step, the charge storage layer (e.g., the floating gate layer) 332A is etched to extend the trenches 338 to at least one of the tunnel dielectric 330 and the semiconductor channel 320. In the embodiment which includes the lower polysilicon control gate layer 336B, the second etching step includes etching the polysilicon control gate layer 336B, the blocking dielectric layer 334 and the charge storage layer 332A using the hard mask regions 340C as a mask.

The second etching step extends the trenches 338 to at least one of the tunnel dielectric 330 and the semiconductor channel 320. For example, as shown in FIG. 9B, the etch stops on the tunnel dielectric 330 such that the tunnel dielectric 330 remains continuous throughout the active cell areas 604A, 604B.

The second etch step also completes the formation of the plurality of control gates 336. Each control gate 336 has an upper metal or metal nitride (e.g., tungsten or tungsten nitride) portion 336C and a lower polysilicon portion 336D. Furthermore, the second etch step forms a discrete charge storage region, such as a floating gate 332, and a blocking dielectric 334 region above a respective floating gate 332 and below each of the plurality of control gates 336.

During the second etching step, the remaining reactive layer (e.g., silicon layer) 350 located in the trenches 338 and over the hard mask 340 and hard mask regions 340C in the stacks 176 is removed. However, the silicide spacers 352 are not removed. Thus, the second etching step is preferably conducted using an etching medium that has a high etch selectivity to etching silicon in layers 332A, 336B and 350 and silicon oxide (or other insulators) in blocking dielectric 334 compared to metal silicide of the spacers 352.

In an alternative embodiment, rather than forming metal-Group IV compound (e.g., metal silicide) spacers 352, other metal compound material spacers may be formed. In this embodiment, the control gate layer 336A may be a metal layer, such as a tungsten or titanium layer having metal sidewalls 348 exposed in the trenches 338. In this embodiment, the step of reacting the reactive material includes providing a nitrogen containing plasma (e.g., ammonia plasma) to the trenches 338 to react the nitrogen containing plasma with the metal sidewalls 348. This forms metal nitride sidewall spacers 352, such as tungsten nitride or titanium nitride spacers, on the metal (e.g., W or Ti) control gates 336.

Figure 10:
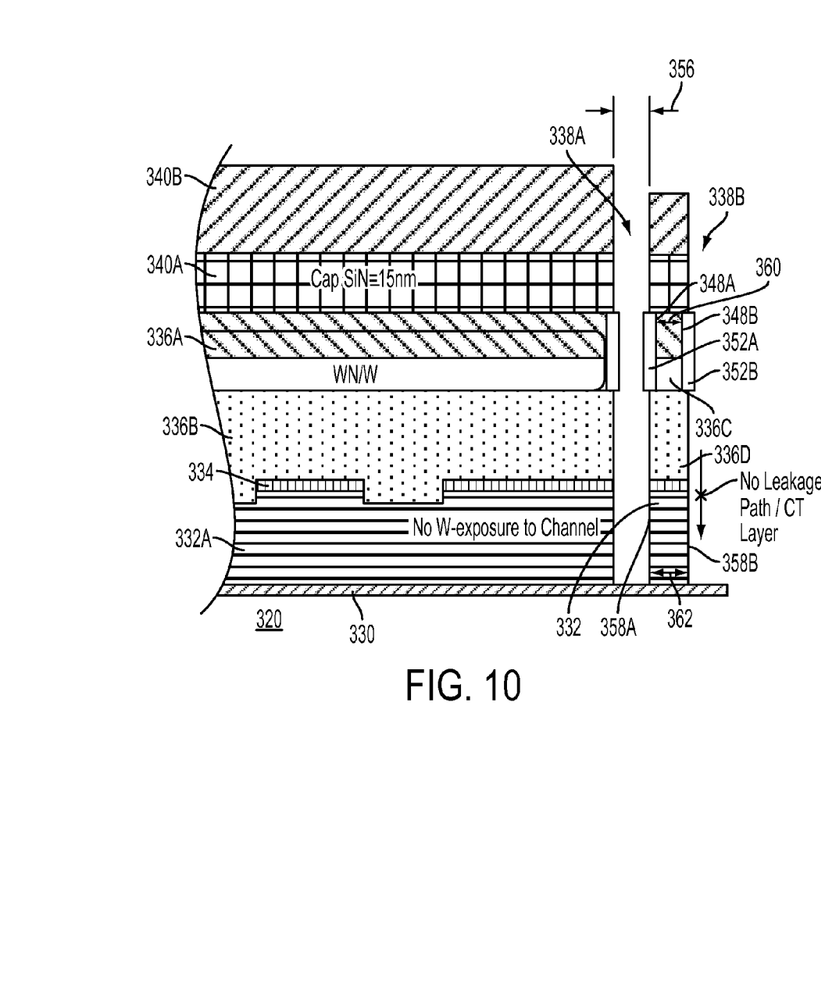
FIG. 10 is a side cross-section view of a portion of a NAND string according to one embodiment.
Figure 11:
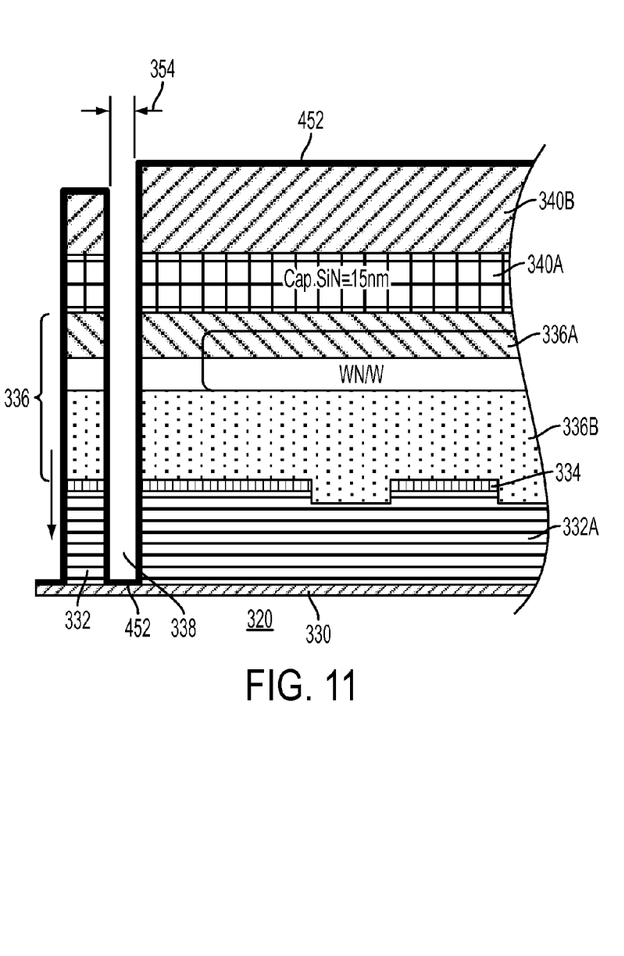
FIG. 11 is a side cross-section view of a portion of a NAND string according to a comparative example.

FIG. 10 shows a close up view of the active memory cell area 604A of FIG. 9B. The spacers 352, such as the tungsten silicide sidewall spacers, prevent or reduce an amount of at least one of tungsten oxide whiskers and tungsten diffusion during the second etching step. As shown in FIG. 11 and as described in co-pending U.S. application Ser. No. 13/690,054 filed on Nov. 30, 2012 and incorporated herein by reference in its entirety, in a comparative example, a silicon oxide or silicon nitride layer 452 is formed in the trenches 338 to cover the sidewalls 348 of the control gates 336. However, thick silicon oxide or nitride layers are needed to provide sufficient barrier properties. The thick silicon oxide or nitride layers may create undesirable charge trapping regions and/or current leakage paths (shown by arrow in FIG. 11), and clog the trenches 338 to decrease the width 354 of the open space in the trenches 338. In contrast, relatively thin metal silicide spacers 352 provide an effective diffusion barrier without creating the charge trapping regions and/or current leakage paths, and without clogging the trenches due to their smaller thickness and recess into the control gates. Thus, the open space width 356 in the trenches is increased, as shown in FIG. 10.

Following the second etching step the memory devices are completed using any suitable processing methods, such as those described in the U.S. application Ser. No. 13/690,054 filed on Nov. 30, 2012. Various back end processes can be performed to finalize fabrication of the NAND memory array. For example, the select gates are patterned in area 606, a passivation dielectric layer can be deposited, followed by forming metal conductive lines and vias to connect the lines with source and drain regions at the end of the memory cell strings, etc.

Figure 12:
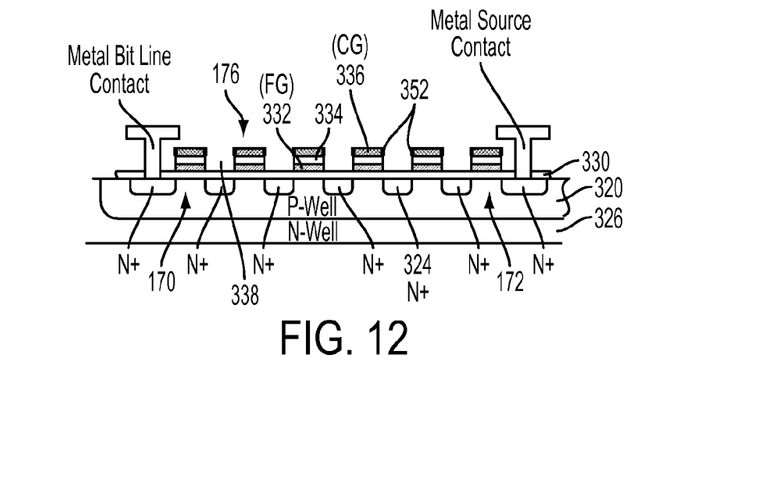
FIG. 12 is a side cross-section view of a NAND string according to one embodiment.
Figure 13:
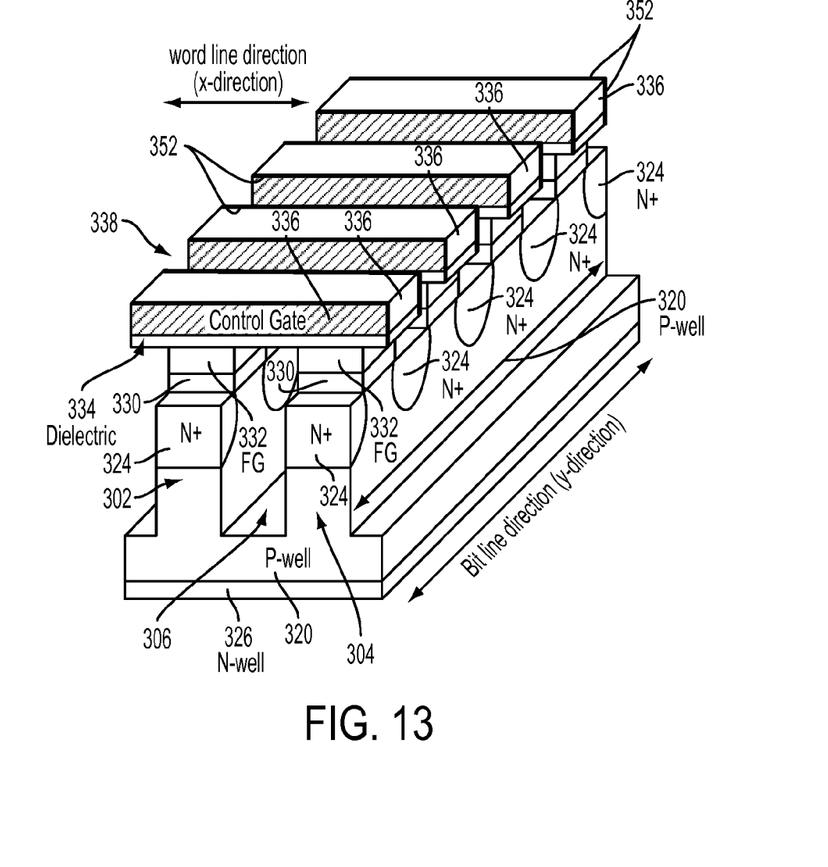
FIG. 13 is a three-dimensional view of a pair of four word line long portions of two NAND strings according to one embodiment.

FIGS. 12 and 13 schematically illustrate the completed NAND memory devices. The devices shown in FIGS. 12 and 13 have the same elements as those shown in respective FIGS. 4 and 5, except for the presence of the sidewall spacers 352 on the sidewalls 348 of the control gates 336. Thus, the common elements will not be described again for brevity. As shown in FIGS. 12 and 13, the plurality of control gates 336 (e.g., metal or metal nitride portions 336C if bilayer control gates are used) are separated by the trenches 338. Each control gate is located over a respective one of the plurality of blocking dielectric regions 334.

As shown in FIGS. 10, 11 and 12, the sidewall spacers 352 protrude into the trenches 338 beyond the hard mask regions 340C, the floating gates 332 and the lower polysilicon portions 336D of the control gates 336. Specifically, the sidewall spacers 352 protrude into the trenches 338 beyond sidewalls 358 of respective floating gates 332 located under the control gates 336. As shown in FIG. 10, each control gate 336 comprises a first sidewall spacer 352A on a first control gate sidewall 348A in a first trench 338A and a second sidewall spacer 352B on a second control gate sidewall 348B in a second trench 338B. A width 360 of each control gate 336 comprises a distance from the first control gate sidewall 348A to the second control gate sidewall 348B. Each floating gate 332 comprises a first floating gate sidewall 358A exposed in the first trench 338A and a second floating gate sidewall 358B exposed in the second trench 338B. A width 362 of each floating gate comprises a distance from the first floating gate sidewall 358A to the second floating gate sidewall 358B. The width 362 of each floating gate 332 is greater than the width 360 of each respective control gate 336 located above the respective floating gate 332 because the spacers 352 are formed by a reaction of the control gate with a reactive material. Thus, the spacers 352 also extend into the stack 176 and cause the control gate width 360 to be smaller than the floating gate width 362.

While tungsten and tungsten nitride control gates are described above, it should be noted that the control gates may comprise other metals (e.g., titanium) or conductive metal oxides (e.g., ruthenium oxide) or doped semiconductors (e.g., polysilicon, polycrystalline silicon germanium or single crystalline silicon). Thus, the metal, metal nitride or metal oxide control gates, such as tungsten, tungsten nitride or ruthenium oxide control gates can be silicided to form spacers by reacting the control gate with a silicon (e.g., amorphous silicon or polysilicon) layer. Alternatively, if the control gates comprise a doped silicon or silicon germanium, then such control gates can be silicided to form spacers by reacting the control gates with a metal layer (e.g., tungsten, titanium or other silicide forming metal layer).

The foregoing method descriptions are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not necessarily intended to limit the order of the steps; these words may be used to guide the reader through the description of the methods. Further, any reference to claim elements in the singular, for example, using the articles "a," "an" or "the" is not to be construed as limiting the element to the singular.

The preceding description of the disclosed aspects is provided to enable any person skilled in the art to make or use the present invention. Various modifications to these aspects will be readily apparent to those skilled in the art, and the generic principles defined herein may be applied to other aspects without departing from the scope of the invention. Thus, the present invention is not intended to be limited to the aspects shown herein but is to be accorded the widest scope consistent with the principles and novel features disclosed herein.

What is claimed is:

1. A method of making a NAND string, comprising:
forming a tunnel dielectric over a semiconductor channel;
forming a charge storage layer over the tunnel dielectric;
forming a blocking dielectric over the charge storage layer;
forming a control gate layer over the blocking dielectric;
patterning the control gate layer to form a plurality of control gates separated by trenches, wherein the step of patterning the control gate layer comprises a first etching step of etching the control gate layer and stopping the first etching step prior to reaching the semiconductor channel;
reacting a first material with exposed sidewalls of the plurality of control gates to form self aligned metal-first material compound sidewall spacers on the exposed sidewalls of the plurality of control gates; and
a second etching step of etching the charge storage layer after the step of forming the metal silicide sidewall spacers to extend the trenches to at least one of the tunnel dielectric and the semiconductor channel, wherein:
the step of reacting the first material comprises depositing a first material layer into the trenches such that the first material layer contacts exposed metal or metal nitride sidewalls of the plurality of control gates, followed by annealing the first material layer to react the first material layer with the exposed metal or metal nitride sidewalls of the plurality of control gates;
the first material layer comprises a silicon layer and the metal-first material compound sidewall spacers comprise metal silicide sidewall spacers; and
the step of patterning the control gate layer comprises a first etching step of etching the control gate layer and stopping the first etching step prior to reaching the semiconductor channel.

2. A method of making a NAND string, comprising:
forming a tunnel dielectric over a semiconductor channel;
forming a charge storage layer over the tunnel dielectric;
forming a blocking dielectric over the charge storage layer;
forming a control gate layer over the blocking dielectric;
patterning the control gate layer to form a plurality of control gates separated by trenches, wherein the step of patterning the control gate layer comprises a first etching step of etching the control gate layer and stopping the first etching step prior to reaching the semiconductor channel;
reacting a first material with exposed sidewalls of the plurality of control gates to form self aligned metal-first material compound sidewall spacers on the exposed sidewalls of the plurality of control gates, wherein the control gate layer comprises a tungsten or tungsten nitride control gate layer, and the metal silicide sidewall spacers comprise tungsten silicide sidewall spacers, the step of reacting the first material comprises depositing a first material layer into the trenches such that the first material layer contacts exposed metal or metal nitride sidewalls of the plurality of control gates, followed by annealing the first material layer to react the first material layer with the exposed metal or metal nitride sidewalls of the plurality of control gates;

the first material layer comprises a silicon layer and the metal-first material compound sidewall spacers comprise metal silicide sidewall spacers; and the step of patterning the control gate layer comprises a first etching step of etching the control gate layer and stopping the first etching step prior to reaching the semiconductor channel.

3. The method of claim 2, further comprising forming a polysilicon control gate layer over blocking dielectric and under the tungsten or tungsten nitride control gate layer, and forming a hard mask over the tungsten or tungsten nitride control gate layer.

4. The method of claim 3, wherein:

the first etching step comprises etching the hard mask layer and the tungsten or tungsten nitride control gate layer to form a plurality of stacks separated by the trenches, and stopping the first etching step etch on the polysilicon control gate layer;

each of the plurality of stacks comprises a tungsten or tungsten nitride control gate covered by a hard mask region;

the step of depositing the silicon layer into the trenches comprises depositing an amorphous silicon layer into the trenches and over the hard mask regions of the plurality of stacks such that the amorphous silicon layer contacts upper portions of the polysilicon control gate layer exposed in the trenches; and the step of annealing comprises rapid thermal annealing.

5. The method of claim 4, further comprising a second etching step of etching the polysilicon control gate layer, the blocking dielectric and the charge storage layer after the step of forming the metal silicide sidewall spacers using the hard mask regions as a mask to extend the trenches to at least one of the tunnel dielectric and the semiconductor channel, to form a discrete charge storage region below each of the plurality of control gates, and to complete formation of the plurality of control gates each having a lower polysilicon portion and an upper tungsten or tungsten nitride portion.

6. The method of claim 5, wherein:

the charge storage layer comprises a polysilicon floating gate layer;

the discrete charge storage region comprises a floating gate;

the amorphous silicon layer is removed from over the hard mask regions during the second etching step;

the tungsten silicide sidewall spacers protrude into the trenches beyond the hard mask regions, the floating gates and the lower polysilicon portions of the control gates; and the tungsten silicide sidewall spacers prevent or reduce an amount of at least one of tungsten oxide whiskers and tungsten diffusion during the second etching step.

7. A method of making a NAND string, comprising:

forming a tunnel dielectric over a semiconductor channel;
forming a charge storage layer over the tunnel dielectric;
forming a blocking dielectric over the charge storage layer;
forming a control gate layer over the blocking dielectric;
patterning the control gate layer to form a plurality of control gates separated by trenches, wherein the step of patterning the control gate layer comprises a first etching step of etching the control gate layer and stopping the first etching step prior to reaching the semiconductor channel;

reacting a first material with exposed sidewalls of the plurality of control gates to form self aligned metal-first material compound sidewall spacers on the exposed sidewalls of the plurality of control gates, wherein:

the exposed sidewalls of the plurality of control gates comprise exposed metal sidewalls;

the step of reacting the first material comprises providing a nitrogen containing plasma into the trenches to react the nitrogen containing plasma with the metal sidewalls; and the metal-first material compound sidewall spacers comprise metal nitride sidewall spacers.

8. The method of claim 7, wherein the metal comprises tungsten and the metal nitride sidewall spacers comprise tungsten nitride sidewall spacers on a tungsten control gates.

* * * * *